(12) United States Patent
Dietz (10) Patent No.: US 10,908,241 B2
(45) Date of Patent: Feb. 2, 2021

(54) GRADIENT COIL UNIT FOR A MAGNETIC RESONANCE APPARATUS

(71) Applicant: Siemens Healthcare GmbH, Erlangen (DE)

(72) Inventor: Peter Dietz, Fuerth (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/395,920

(22) Filed: Apr. 26, 2019

(65) Prior Publication Data
US 2019/0331748 A1 Oct. 31, 2019

(30) Foreign Application Priority Data
Apr. 27, 2018 (DE) .................. 10 2018 206 643

(51) Int. Cl.
G03G 15/16 (2006.01)
G01R 33/385 (2006.01)

(52) U.S. Cl.
CPC .................. *G01R 33/3858* (2013.01)

(58) Field of Classification Search
CPC .. A61B 5/055; G01R 33/4828; G01R 33/543; G01R 33/5608; G01R 33/50
USPC ........................................................ 324/318
See application file for complete search history.

(56) References Cited

U.S. PATENT DOCUMENTS

| 6,351,123 | B1 | 2/2002 | Gebhardt |
| 7,141,974 | B2 | 11/2006 | Baig |
| 7,365,542 | B1* | 4/2008 | Rohling ........... G01R 33/34084 324/318 |
| 7,728,707 | B2* | 6/2010 | Gilardi ............... G01R 33/3806 335/296 |
| 8,766,635 | B2 | 7/2014 | Kidane et al. |
| 2003/0090268 | A1 | 5/2003 | Endt |
| 2005/0099180 | A1* | 5/2005 | Nistler ............. G01R 33/34046 324/318 |
| 2010/0117648 | A1* | 5/2010 | Riegler ................ G01R 33/385 324/318 |
| 2011/0121832 | A1* | 5/2011 | Shvartsman ....... G01R 33/3856 324/318 |
| 2017/0139022 | A1* | 5/2017 | Lee .................... G01R 33/3802 |

FOREIGN PATENT DOCUMENTS

| DE | 19829298 C2 | 5/2000 |
| DE | 102005033955 A1 | 2/2007 |
| DE | 10151668 B4 | 8/2010 |

\* cited by examiner

*Primary Examiner* — Walter L Lindsay, Jr.
*Assistant Examiner* — Frederick Wenderoth
(74) *Attorney, Agent, or Firm* — Schiff Hardin LLP (57) ABSTRACT

The invention relates to a gradient coil unit comprising a first conductor structure arranged on a surface of a first cylinder with the first radius, a second conductor structure arranged on a surface of a second cylinder with the second radius and a third conductor structure arranged on a surface of a third cylinder with the third radius, wherein the first radius is smaller than the second radius and the second radius is smaller than the third radius.

12 Claims, 5 Drawing Sheets

GRADIENT COIL UNIT FOR A MAGNETIC RESONANCE APPARATUS

BACKGROUND OF THE INVENTION

Field of the Invention

The invention concerns a gradient coil unit for a magnetic resonance apparatus, the gradient coil unit having a first conductor structure, a second conductor structure, a third conductor structure. The invention also concerns a magnetic resonance apparatus that includes such a gradient coil unit.

Description of the Prior Art

In a magnetic resonance scanner, the body of an examination subject, in particular a patient, is typically exposed, with the use of a basic field magnet, to a relatively basic main magnetic field, for example 1.5, 3 or 7 tesla, in a patient receiving region of the scanner. In addition, gradient pulses are activated by a gradient coil unit. Radio-frequency pulses (RF pulses), in particular excitation pulses, are emitted via a radio-frequency antenna unit with suitable antennas. Nuclear spins of certain atoms that are resonantly excited by these RF pulses are tilted by a defined flip angle relative to the magnetic field lines of the basic magnetic field. During relaxation of the nuclear spins, radio-frequency signals, called magnetic resonance signals, are emitted and received by suitable radio-frequency antennas and are further processed. The desired image data can be reconstructed from the raw data acquired in this way.

A gradient coil unit is typically designed to generate a magnetic field gradient in at least one spatial direction. The gradient coil unit is controlled with electric currents having amplitude values that reach several 100 A, and that are subject to frequent and rapid changes in the direction of the current with rise and decay rates of several 100 kA/s. The positioning of the gradient coil unit within the basic field magnet of the magnetic resonance scanner results in a large force acting on the gradient coil unit. The force is associated with torque, which can result in movement and/or bending of the gradient coil unit. This can result in vibrations during the operation of the gradient coil unit.

Stronger magnetic field gradients and/or rise and decay rates typically enable faster recording of raw data and/or a higher resolution of the image data. In the case of examinations of the head of an examination subject, particularly with diffusion-weighted recordings and/or when using a magnetic resonance scanner with a basic magnetic field of more than 3 tesla, particularly strong magnetic field gradients of up to 250 mT/m, with rise and decay rates of up to 1000 T/s/m, in special cases up to 2000 T/s/m, are desirable. In addition to increased vibrations of the gradient coil unit, such specifications of the gradient coil unit are limited by interaction with the examination subject. For example, when the gradient coil unit built into the magnetic resonance scanner, peripheral nerve stimulation of the examination subject occurs with a magnetic field gradient from 20 mT/m and a rate of rise of 100 T/s/m. It is known that the smaller the examination region enclosed by the gradient coil unit and/or the smaller the radial diameter of the gradient coil unit, the more efficiently higher magnetic field gradients and/or rise and decay rates can be achieved.

In particular for head examinations, gradient coil units are known, that, when needed, can be positioned within the patient receiving region. Examples are disclosed in DE19829298C2, DE10151668B4 and DE102005033955A1.

SUMMARY OF THE INVENTION

An object of the invention is to provide a low-vibration gradient coil unit for generating magnetic field gradients with reduced peripheral nerve stimulation in the trunk of the body of the examination subject, and with reduced electromagnetic interaction outside the patient receiving region.

This object is achieved in accordance with the invention by a gradient coil unit having a first conductor structure that defines a surface of a first cylinder having a first radius, a second conductor structure that defines a surface of a second cylinder having a second radius, and a third conductor structure that defines a surface of a third cylinder having a third radius, wherein the first radius is smaller than the second radius and the second radius is smaller than the third radius.

A conductor structure is formed by an electric conductor. The geometric arrangement of the electric conductor is referred to as a conductor structure. A conductor structure on a cylinder is typically saddle-shaped. The radius of the cylinder determines the curvature of the conductor structure in the radial direction. Accordingly, the gradient coil unit according to the invention is embodied as a three-layer arrangement, wherein the first conductor structure, the second conductor structure and the third conductor structure each have a saddle shape, in different layers. The gradient coil unit can also have a fourth conductor structure that defines a surface of a fourth cylinder with a fourth radius, wherein the fourth radius is smaller than the first radius or larger than the third radius. The first conductor structure and the second conductor structure are connected to one another in an electrically conductive manner. The second conductor structure and the third conductor structure are connected to one another in an electrically conductive manner.

The first radius is typically smaller than 27 cm, preferably smaller than 25 cm, particularly preferably smaller than 23 cm. The first radius is typically larger than 16 cm, preferably larger than 19 cm, particularly preferably larger than 22 cm. The second radius is typically smaller than 34 cm, preferably smaller than 32 cm, particularly preferably smaller than 30 cm. The second radius is typically larger than 25 cm, preferably larger than 27 cm, particularly preferably larger than 29 cm. The third radius is typically smaller than 45 cm, preferably smaller than 40 cm, particularly preferably smaller than 35 cm. The third radius is typically larger than 28 cm, preferably larger than 30 cm, particularly preferably larger than 32 cm. The third radius is typically at least 3 cm, preferably at least 5 cm, particularly preferably at least 7 cm, larger than the second radius.

An advantage of the gradient coil unit according to the invention is that the three-layer design simultaneously enables effective compensation of torque that is exerted on the generation of a magnetic field gradient, and compensation of the resulting stray magnetic field.

The first conductor structure, second conductor structure and third conductor structure of the gradient coil unit according to the invention are designed to generate a magnetic field gradient in a spatial direction. The gradient coil unit can have additional conductor structures to generate magnetic field gradients in additional spatial directions. Preferably, the gradient coil unit has three additional conductor structures for generating a magnetic field gradient in an additional spatial direction. The gradient coil unit can have at least two further additional conductor structures for generating a magnetic field gradient in a further spatial direction.

In an embodiment of the gradient coil unit, the third conductor structure at least partially radially surrounds the second conductor structure and the second conductor structure at least partially radially surrounds the first conductor structure. At least a partial region of the gradient coil unit typically has the shape of a hollow cylinder. In this partial region, the first conductor structure, the second conductor structure and the third conductor structure preferably each have a saddle shape, in the different layers. The first radius, the second radius and the third radius are the respective distances of the first conductor structure, the second conductor structure and the third conductor structure from a central axis of the hollow cylinder described by the partial region. The parts of the first conductor structure, the second conductor structure and the third conductor structure arranged in this partial region of the gradient coil unit are concentric.

An advantage of this embodiment is that the gradient coil unit can be produced in a particularly compact form and with a small radial extent. This enables space-saving integration of the gradient coil unit within the housing of a magnetic resonance device and/or a flexibly usable gradient coil unit with a large inner radius and/or a small outer radius. A large inner radius enables comfortable positioning of the examination subject in the examination region and/or additional integration and/or positioning of a radio-frequency antenna unit in the examination region surrounded by the gradient coil unit. This enables the generation of particularly high magnetic field gradients of up to 200 mT/m, preferably up to 250 mT/m, in a particularly short time, i.e. for example within 0.2 ms. Moreover, the positioning of the radio-frequency antenna unit within the gradient coil unit enables the generation of radio-frequency pulses with a particularly homogeneous spatial distribution in the examination region. Both these have a positive influence on the resulting quality of the image data and/or shorten the duration of the recording of raw data.

A radio-frequency antenna unit positioned in the examination region surrounded by the gradient coil unit typically has at least two radio-frequency antennas with at least two channels for individual activation of the at least two radio-frequency antennas.

In an embodiment of the gradient coil unit, the first conductor structure is shorter in the longitudinal direction than the second conductor structure and the third conductor structure.

The gradient coil unit typically has the shape of a hollow cylinder and the cross section of the gradient coil unit in a plane perpendicular to the longitudinal axis at a position of the maximum or minimum extent in the longitudinal direction can be referred to as the longitudinal end of the gradient coil unit. According to this embodiment, the inner first conductor structure has a shorter length than the second conductor structure and the third conductor structure, and the third conductor structure at least partially radially surrounds the second conductor structure and the second conductor structure at least partially radially surrounds the first conductor structure. The first conductor structure, the second conductor structure and the third conductor structure are preferably arranged flush at a first longitudinal end of the gradient coil unit, in particular terminating at the first longitudinal end. The first conductor structure preferably terminates at a second longitudinal end opposite the first longitudinal end, while the second conductor structure and/ or the third conductor structure are embodied such that they extend to a third longitudinal end.

Accordingly, the gradient coil unit in to this embodiment can be asymmetrical. The examination region is typically the region enclosed by the gradient coil unit within which raw data can be recorded from an examination subject, provided that the examination subject is at least partially positioned within the examination region. The gradient coil unit in this embodiment enables particularly good positioning of the head of a patient, as the examination subject, within the examination region. The caudal region of the head is connected to the neck and the shoulder region, and the shoulder region has a larger radial circumference than the head and the neck. The gradient coil unit is preferably dimensioned such that the first radius is larger than a radius of an average head, but smaller than half the lateral extent of an average shoulder region. The second radius and/or the third radius is preferably larger than half the lateral extent of an average shoulder region.

The region enclosed by the first conductor structure is called the examination region. The gradient coil unit is preferably designed such that the head of an examination subject can be positioned centrally within the examination region while the shoulder region of the examination subject can be positioned outside the examination region and at the same time enclosed by the second conductor structure and/or the third conductor structure. The first radius is preferably selected such that a radio-frequency antenna unit can be positioned between the inner surface of the first conductor structure and a head of the examination subject.

An advantage of this embodiment is that the head of the examination subject can be positioned comfortably within the center of the examination region and the radius of the first conductor structure is smaller, typically smaller than 26 cm. As a result, the gradient coil unit can be operated particularly efficiently and with particularly high magnetic field gradients and rise and decay rates, such as, for example, 200 mT/m and 2000 T/s/m. The maximum magnetic field gradient that can be generated by the gradient coil unit maximum is typically at least 150 mT/m, preferably at least 200 mT/m. The maximum rise and/or decay rate achievable by the gradient coil unit is typically at least 800 T/s/m, preferably at least 1000 T/s/m, particularly preferably at least 1500 T/m/s. In addition, the influence of the magnetic field gradient on the trunk of the body of the examination subject can be reduced so that it is still possible to adhere to the limit value for peripheral nerve stimulation.

In another embodiment of the gradient coil unit, the first conductor structure and the second conductor structure are jointly designed to generate a magnetic field gradient in one direction in an examination region enclosed by the first conductor structure.

A magnetic field gradient is typically a magnetic field that rises linearly in a spatial direction. A magnetic field gradient is typically generated temporarily by electric currents in a conductor structure. The electric currents are typically generated in accordance with the specification for an MR control sequence by a gradient control unit in the gradient coil unit, in particular on the activation of the gradient coil unit and/or the magnetic resonance device. A magnetic field gradient is typically referred to as homogeneous if the magnetic field gradient rises linearly in a spatial direction. A magnetic field gradient is referred to as homogeneous if the gradient of the magnetic field generated thereby, in particular its spatial derivative, is constant.

Depending on their arrangement and/or design, the first conductor structure and the second conductor structure preferably determine the embodiment of the magnetic field gradient when electric current is applied in the first conductor structure and/or the second conductor structure. Due to the preferably small first radius, a magnetic field gradient can be generated particularly efficiently. The first conductor structure and the second conductor structure preferably replace a conventional primary coil, which normally has its own conductor structure.

The first conductor structure and the second conductor structure are each present twice in the gradient coil unit, in a symmetrical arrangement to one another. Depending on their spatial positioning, these conductor structures are jointly embodied to generate a magnetic field gradient in the x-direction or y-direction.

In an embodiment of the gradient coil unit, the first conductor structure and/or the second conductor structure is designed to compensate torque that occurs on the gradient coil unit upon generation of a magnetic field gradient.

During the operation of the gradient coil unit, typically, a first electric current flows in the first conductor structure and/or a second electric current flows in the second conductor structure and a third electric current flows in the third conductor structure. The interaction of the first electric currents in the first conductor structure and the second electric current in the second conductor structure and the third electric current in the third conductor structure, with the basic magnetic field acting in the region of the first conductor structure and second conductor structure and third conductor structure, produces a Lorentz force, which in turn exerts torque on the gradient coil unit. This can lead to vibrations during the operation of the gradient coil unit.

In the case of conventional symmetrical conductor structures and symmetrical gradient coil units, which can be divided into four mutually symmetrical quadrants, forces acting on different positions of the conductor structure can at least partially cancel each other. This typically results in negligible torque. However, a gradient coil unit with a symmetrical embodiment that has been optimized with respect to the recording of raw data from the head of an examination subject has numerous drawbacks. For example, the recording of high-quality raw data requires the region to be examined, in particular the head, of the examination subject to be positioned in the center of the gradient coil unit. In view of the required dimensions of the conductor structure in the longitudinal direction of a conventional symmetrical gradient coil unit, the head of an examination subject typically can be positioned only in the center of the gradient coil unit if the symmetrical gradient coil unit is configured to receive the head, neck and shoulder region of the examination subject. This requires a large radius of the examination region, which reduces the efficiency of the gradient coil unit.

The first conductor structure of the inventive gradient coil unit is preferably shorter in the longitudinal direction than the second conductor structure and the third conductor structure. It is possible to identify spatial regions of the gradient coil unit in which a particularly high torque acts, due to the Lorentz force. These regions are in particular positioned at the longitudinal end of the first conductor structure facing the trunk of the body. If the first conductor structure were inherently embodied to compensate torque, this would require a longer extent along the longitudinal axis. This would enable only the head to be positioned in the center of the gradient coil unit with a simultaneously larger radius and this would be associated with reduced efficiency.

Forces and/or torques due to a first electric current in the first conductor structure are preferably reduced and/or compensated by a second electric current in the second conductor structure. This enables the first conductor structure to be free of an additional conductor loop for torque compensation, for example at a longitudinal end of the first conductor structure facing away from the trunk of the body. Moreover, the second conductor structure can be arranged predominantly at the longitudinal end of the second conductor structure facing the trunk of the body. This enables a short extent of the gradient coil unit in the direction facing away from the trunk of the body. The first electric current and the second electric current and/or the third electric current can be different from one another. The first electric current and/or the second electric current and/or the third electric current can be offset in time and/or different in magnitude. The first electric current and/or the second electric current and/or the third electric current can also be equal in magnitude and/or simultaneous.

This embodiment of the gradient coil unit enables efficient generation of a magnetic field gradient by the first and the second conductor structure, wherein the first and the second conductor structure are designed to compensate torque. In particular, such a gradient coil unit can have a particularly small first radius and simultaneously enable the head of an examination subject to be positioned in the center of the examination region of the gradient coil unit, as a result of which the efficiency of the gradient coil unit is particularly high.

In another embodiment of the gradient coil unit, the third conductor structure is designed to compensate a stray magnetic field that occurs upon generation of the magnetic field gradient by the first conductor structure and/or the second conductor structure. The third conductor structure preferably has a symmetrical design. The third conductor structure can also be designed such that a maximum of 40%, preferably a maximum of 30%, particularly preferably a maximum of 20%, of the third conductor structure is situated in the half of the gradient coil unit facing away from the trunk of the body.

A stray magnetic field is typically a magnetic field that, on the activation of the first conductor structure and/or the second conductor structure, i.e. on the application of an electric current in the first conductor structure and/or the second conductor structure, occurs outside the patient receiving region and/or the examination region. The stray magnetic field typically does not contribute to imaging, but may adversely affect imaging. The stray magnetic field can interact with the components surrounding the gradient coil unit. For example, in an environment that is adjacent to the gradient coil unit and that is electrically conductive, such as a wall that seals the cryostat of the basic field magnet inwardly, a temperature shield and/or a radio-frequency antenna unit, an electric current can be generated and/or heating can occur. It has been recognized that, particularly in the radial outer region of the gradient coil unit, in the region of wall that seals the cryostat of a basic field magnet inwardly and/or a temperature shield, a stray magnetic field and/or eddy currents induced by a stray magnetic field can adversely affect the efficiency of cooling of the basic field magnet and/or the homogeneity of a magnetic field gradient generated by the gradient coil unit. The third conductor structure of the gradient coil unit according to the invention can be designed such that an electric current in the third conductor structure causes a reduction of the stray magnetic field, and in particular electromagnetic interaction is reduced.

In this embodiment of the gradient coil unit, the first conductor structure and the second conductor structure are designed to generate a magnetic field gradient and to compensate torque occurring therefrom. The third conductor structure is preferably predominantly optimized to compensate a stray magnetic field that is generated by the first conductor structure and the second conductor structure. Conventionally, particularly in the case of known gradient coil units that can be positioned flexibly within a patient receiving region of a magnetic resonance scanner, compensation of a stray magnetic field has been neglected due to the distance from the cryostat of the basic field magnet. This embodiment enables reduced heating of the cryostat of the basic field magnet, thus resulting in lower energy input and/or requiring less coolant. This is advantageous in the case of superconducting basic field magnets with superconductors without immersion in a superconducting medium.

In another embodiment of the gradient coil unit, in a protruding region of the second conductor structure in which the first conductor structure is shorter in the longitudinal direction than the second conductor structure, the second conductor structure is designed to reduce torque that occurs on the gradient coil unit upon generation of a magnetic field gradient.

When the head of an examination subject is positioned in the gradient coil unit, the protruding region is situated at the longitudinal end of the gradient coil unit facing the trunk of the body. The second conductor structure is preferably predominantly arranged in the protruding region. Preferably, a maximum of 30%, more preferably a maximum of 20%, particularly preferably a maximum of 10% of the second conductor structure is situated in the half of the gradient coil unit facing away from the trunk of the body. This embodiment of the gradient coil unit enables particularly comfortable positioning of the head of an examination subject within the examination region enclosed by the first conductor structure, since the shoulder region of the examination subject can be positioned within the protruding region. The protruding region has a larger radius than the first radius.

In another embodiment of the gradient coil unit, the gradient coil can be flexibly positioned within the patient receiving region of a magnetic resonance scanner. The gradient coil unit can be arranged and/or fixed on a patient support device of the magnetic resonance scanner. Such a gradient coil unit is typically designed to receive at least a partial region of the examination subject. The gradient coil unit can be positioned before carrying out the examination.

The magnetic resonance scanner can also have a main gradient coil unit. When the inventive gradient coil unit is positioned within the patient receiving region of the magnetic resonance scanner, the inventive gradient coil unit can be used instead of the main gradient coil unit. As a result, it is possible to achieve particularly high magnetic field gradients and/or rise and decay rates particularly efficiently in a partial region, typically the head, of the examination subject, wherein regions of the examination subject lying outside the partial region are less affected by the magnetic field gradients and/or peripheral nerve stimulation. This is in advantageous in the case of a magnetic resonance scanner with a basic magnetic field of more than 3 tesla and/or in the case of dedicated head examinations.

In another embodiment of the gradient coil unit, first conductor structure and/or the second conductor structure and/or the third conductor structure is designed asymmetrically. Such a gradient coil unit enables comfortable positioning of a head in the center of the examination region of the gradient coil unit with simultaneously good torque compensation and stray magnetic field reduction.

In another embodiment of the gradient coil unit, the second conductor structure proceeds spirally around a center point. The second conductor structure can, at least partially, also have a helical and/or annular and/or circular embodiment. Such a second conductor structure enables particularly good torque compensation.

In another embodiment of the gradient coil unit, the third conductor structure surrounds at least two center points spirally in each case. The third conductor structure can, at least partially, also have a helical and/or annular and/or circular embodiment. Such a third conductor structure enables particularly good stray magnetic field reduction.

In another embodiment of the gradient coil unit, the gradient coil unit that has two of each of the first conductor structure, the second conductor structure and the third conductor structure. In each case, the two first conductor structures, the two second conductor structures and the two third conductor structures are respectively situated within one half of the gradient coil unit, and the gradient coil unit is symmetrical. Typically, two mutually symmetrical saddle coils are required to generate a magnetic field gradient. Two first conductor structures arranged mutually symmetrically preferably enable the generation of a magnetic field gradient in one direction. Two second conductor structures arranged mutually symmetrically preferably enable compensation of torque that occurs upon generation of the magnetic field gradient. Two third conductor structures arranged mutually symmetrically preferably enable compensation of a stray magnetic field that occurs upon activation of the first and second conductor structures.

Figure 3:
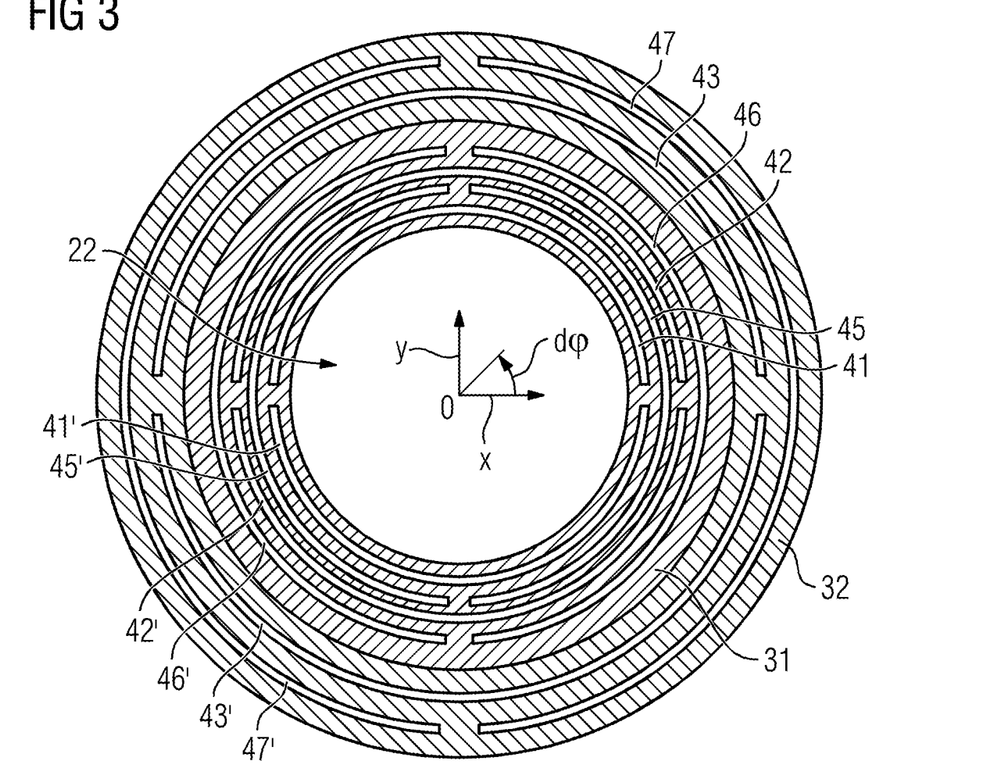
FIG. 3 schematically depicts a first embodiment of the gradient coil unit according to the invention.

The invention also encompasses a magnetic resonance apparatus having a magnetic resonance data acquisition scanner that has a gradient coil unit according to the invention, a gradient controller and a basic field magnet. The magnetic resonance scanner preferably has a gradient coil unit as depicted in FIG. 3, having at least two first conductor structures, two second conductor structures and two third conductor structures. The magnetic resonance scanner can alternatively be a gradient coil unit according to any of the above-described embodiments. The gradient coil unit according to the invention can be integrated in the magnetic resonance scanner. The gradient coil unit according to the invention can also be installed separately from the magnetic resonance scanner. The gradient coil unit according to the invention can be mechanically connected to the magnetic resonance scanner. Embodiments of the magnetic resonance apparatus according to the invention are analogous to the embodiments of the gradient coil unit according to the invention. The magnetic resonance apparatus can have further control components that are necessary and/or advantageous. The magnetic resonance apparatus can be designed to transmit control signals and/or to receive and/or process control signals. The advantages of the magnetic resonance apparatus according to the invention substantially correspond to the advantages of the gradient coil unit according to the invention, as described in detail above. Features, advantages or alternative embodiments mentioned above are also applicable to the inventive magnetic resonance apparatus.

DESCRIPTION OF THE PREFERRED EMBODIMENTS

Figure 1:
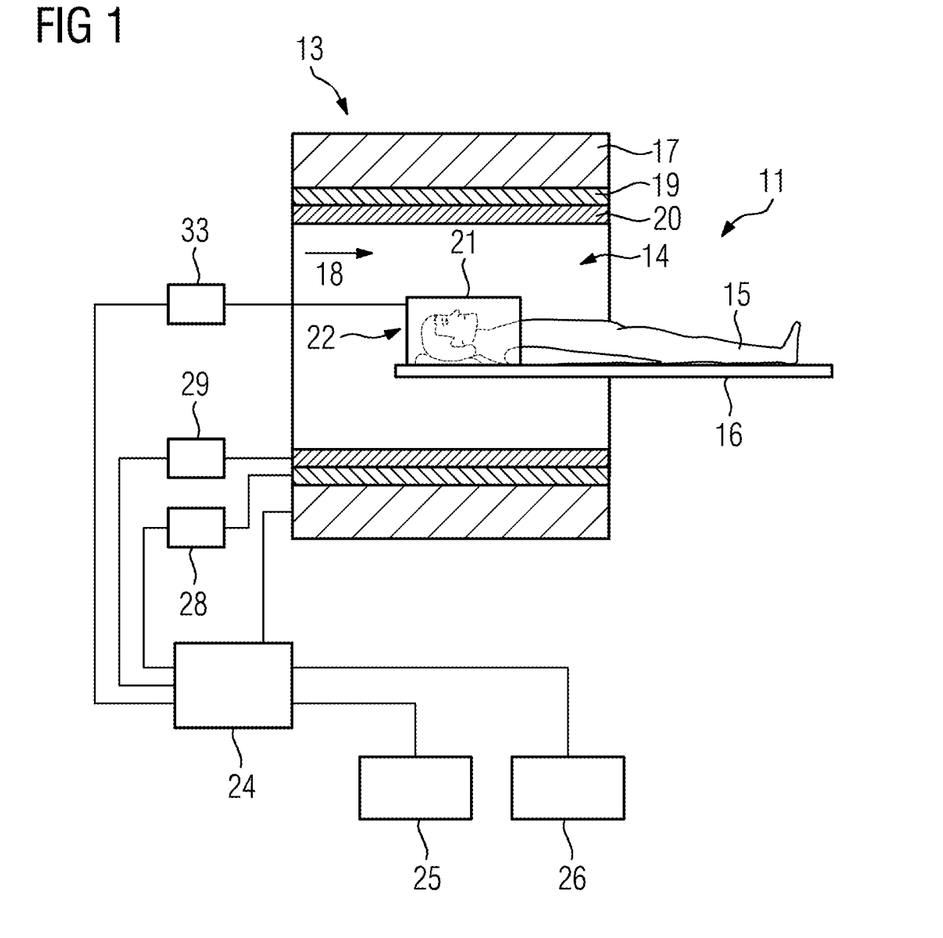
FIG. 1 schematically depicts a magnetic resonance device according to the invention.

FIG. 1 is a schematic depiction of a magnetic resonance apparatus 11 according to the invention. The magnetic resonance apparatus 11 has a scanner 13 with a basic field magnet 17 that generates a strong and constant basic magnetic field 18. In addition, the magnetic resonance scanner 13 has a cylindrical patient receiving region 14 for receiving a patient 15. The patient receiving region 14 is enclosed circumferentially by the scanner 13. The patient 15 can be moved by a patient support device 16 into the patient receiving region 14. To this end, the patient support device 16 has a patient table that is movable within the scanner 13.

The scanner 13 can optionally have a main gradient coil unit 19 used for spatial encoding during imaging. The main gradient coil unit 19 is activated by a main gradient controller 28. The main gradient coil unit 19 is typically used in the absence of a gradient coil 21 unit according to the invention. The gradient coil unit 21 according to the invention can be positioned flexibly within the patient receiving region 14. The gradient coil unit 21 is preferably arranged on the patient support device 16 such that a body part, preferably the head, of the patient 15, can be positioned within the gradient coil unit 21. The area included by the gradient coil unit 21 is referred to as the examination region 22. The gradient coil unit 21 is activated by a gradient controller 33. The scanner 13 also has a radio-frequency antenna unit 20, which, in the case shown, is a body coil permanently integrated in the scanner 13, and a radio-frequency antenna controller 29 that operates radio-frequency antenna unit 20 so as to radiate radio-frequency pulses into an examination area formed by the patient receiving region 14. The radio-frequency pulses excite certain nuclear spins in the patient 15, thereby getting those nuclear spins a magnetization that causes them to deviate from the field lines of the basic magnetic field 18, by an amount known as a flip angle. As the excited nuclear spins relax and return to the steady state, they emit radio-frequency signals, known as MR signals.

Alternatively or additionally, the radio-frequency antenna unit 29 can be designed so as to be positioned in the examination region 22 surrounded by the gradient coil unit 21, and/or can be arranged on the gradient coil unit 21, and/or integrated therein.

To control the basic field magnet 17, the gradient controller 28 and the radio-frequency antenna controller 29, the magnetic resonance apparatus 11 has a control computer 24. The control computer 24 controls the magnetic resonance apparatus 11 centrally, so as to carry out MR control sequences. In addition, the control computer 24 comprises a reconstruction processor (not shown), for the reconstruction of medical image data from the raw data acquired during the magnetic resonance examination. The magnetic resonance apparatus 11 has a display unit 25. Control information such as control parameters, and reconstructed image data, can be displayed on the display unit 25, for example on least one monitor, for a user. In addition, the magnetic resonance apparatus 11 has an input unit 26, via which information and/or control parameters may be entered by a user during a measurement process. The control computer 24 can include the gradient controller 28 and/or the radio-frequency antenna controller 29 and/or the display unit 25 and/or the input unit 26.

The magnetic resonance apparatus 11 depicted can obviously have further components such as those usually present in known magnetic resonance apparatuses. Moreover, the general manner of operation of a magnetic resonance apparatus is known to those skilled in the art so a more detailed description is not necessary herein.

Figure 2:
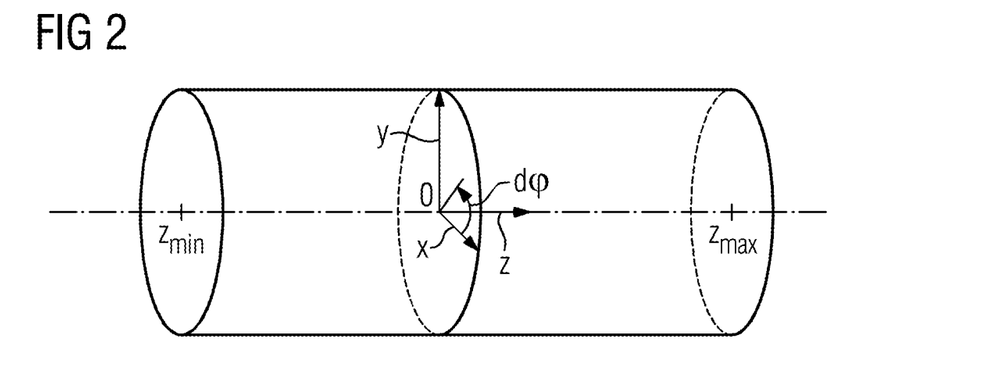
FIG. 2 schematically depicts a gradient coil unit in order to explain parameters thereof.

FIG. 2 is a schematic depiction of a gradient coil unit 21 in order to explain certain parameters thereof. The gradient coil unit 21 typically has or defines a cylindrical outer surface. The gradient coil unit 21 is typically divided into two halves. One half of the gradient coil unit 21 typically includes at least one first conductor structure 41, one second conductor structure 42 and one third conductor structure 43. The gradient coil unit 21 in each of the two halves has at least one first conductor structure 41, one second conductor structure 42 and one third conductor structure 43. The two halves of the gradient coil unit 21 are mutually symmetrical, preferably axially symmetrical.

One half of the gradient coil unit 21 is bounded along the z-axis by the two longitudinal ends of the gradient coil unit 21 at $z_{min}$ and $z_{max}$. One half of the gradient coil unit 21 is determined in a first direction by the maximum extent of the gradient coil unit 21 in the first direction. One half of the gradient coil unit 21 is determined in a second direction by the distance of an outside of the gradient coil unit 21 along the second direction from the origin. The first direction and the second direction are typically perpendicular to one another. If the first conductor structure 41 and the second conductor structure 42 are embodied to generate a magnetic field gradient in the x-direction, the first direction corresponds to the x-direction. If the first conductor structure 41 and the second conductor structure 42 are embodied to generate a magnetic field gradient in the y-direction, the first direction corresponds to the y-direction.

FIG. 3 is a schematic depiction of a first embodiment of the gradient coil unit 21 according to the invention. FIG. 3 shows an axial cross section through the axial center of a first embodiment of the gradient coil unit 21 according to the invention. The gradient coil unit 21 is divided into a primary coil 31 and a secondary coil 32. The primary coil 31 has a first conductor structure 41, 41' and the second conductor structure 42, 42'. The gradient coil unit 21, in particular the primary coil 31, includes the first conductor structure 41, 41', preferably twice. Herein, the two first conductor structures 41, 41' are preferably arranged point-symmetrically to the center point 0 of the examination region 22. The gradient coil unit 21, in particular the primary coil 31, comprises the second conductor structure 42, 42', preferably twice. The two second conductor structures 42, 42' are preferably arranged point-symmetrically to the center point 0 of the gradient coil unit 21. The second conductor structure 42, 42' has a larger radius to the center point 0 of the gradient coil unit 21 than the first conductor structure 41, 41'. The two first conductor structures 41, 41' and the two second conductor structures 42, 42' are jointly embodied to generate a magnetic field gradient in an examination region 22. In the case depicted, the two first conductor structures 41, 41' and the two second conductor structures 42, 42' are jointly embodied to generate a magnetic field gradient in the x-direction. In each case, a first conductor structure 41 and a second conductor structure 42 are typically arranged within one half of the gradient coil unit 21. The other first conductor structure 41' and the other second conductor structure 42' are typically arranged within the other half of the gradient coil unit 21.

Furthermore, the primary coil 31 depicted has an additional first conductor structure 45, 45' twice and an additional second conductor structure 46, 46' twice. The two additional first conductor structures 45, 45' and the two additional second conductor structures 46, 46' are typically structured similarly to the two first conductor structures 41, 41' and the two second conductor structures 42, 42', but differ by an angle dφ of 90°. Consequently, in the case depicted, the two additional first conductor structures 45, 45' and the two additional second conductor structures 46, 46' are jointly embodied to generate a magnetic field gradient in the y-direction. Consequently, the primary coil 31 depicted is embodied to generate magnetic field gradients in the x-direction and y-direction.

The secondary coil 32 preferably includes a third conductor structure 43, 43'. The gradient coil unit 21, in particular the secondary coil 32, comprises the third conductor structure 43, 43', preferably twice. Herein, the two third conductor structures 43, 43' are preferably arranged point-symmetrically to the center point 0 of the gradient coil unit 21. The secondary coil 32, in particular the third conductor structure 43, 43', is embodied to compensate a stray magnetic field that occurs upon generation of a magnetic field gradient by means of the two first conductor structures 41, 41' and the two second conductor structures 42, 42'. The secondary coil 32 preferably has a larger radius, in particular with respect to the center point 0 of the gradient coil unit 21, than the primary coil 31.

Furthermore, the secondary coil 32 depicted has an additional third conductor structure 47, 47' twice. The two additional third conductor structures 47, 47' are typically structured similarly to the two third conductor structures 43, 43', but differ by an angle dφ of 90°. Consequently, in the case depicted, the two additional third conductor structures 47, 47' are jointly designed to compensate a stray magnetic field that occurs upon generation of a magnetic field gradient by the two additional first conductor structures 45, 45' and the two additional second conductor structures 46, 46'. Accordingly, the additional third conductor structure 47, 47' is designed to compensate a stray magnetic field that occurs upon generation of a magnetic field gradient in the y-direction. The secondary coil 31 depicted is consequently designed to compensate stray magnetic fields that occur upon generation of magnetic field gradient in the x-direction and y-direction.

The gradient coil unit 21 preferably has a further conductor structure, not depicted in further detail, formed by the primary coil 31, which is designed to generate a magnetic field gradient in the z-direction. The gradient coil unit 21 also preferably has a further conductor structure, not depicted in further detail, formed by the secondary coil 32, which is designed to compensate a stray magnetic field that occurs upon generation of a magnetic field gradients in the z-direction.

The conductor structures 41, 42, 43, 45, 46, 47, 41', 42', 43', 45', 46', 47' are typically arranged at least partially concentrically and/or interleaved. Their sequence, in particular their distance to the center point 0 of the gradient coil unit 21 is depicted by way of example in FIG. 3 and can also be embodied in another way. In particular, the third conductor structure 43, 43' at least partially radially surrounds the second conductor structure 42, 42' and the second conductor structure 42, 42' at least partially radially surrounds the first conductor structure 41, 41'. The third conductor structure 43, 43' and the second conductor structure 42, 42' are arranged concentrically. The first conductor structure 41, 41' and the second conductor structure 42, 42' are concentric.

Figure 4:
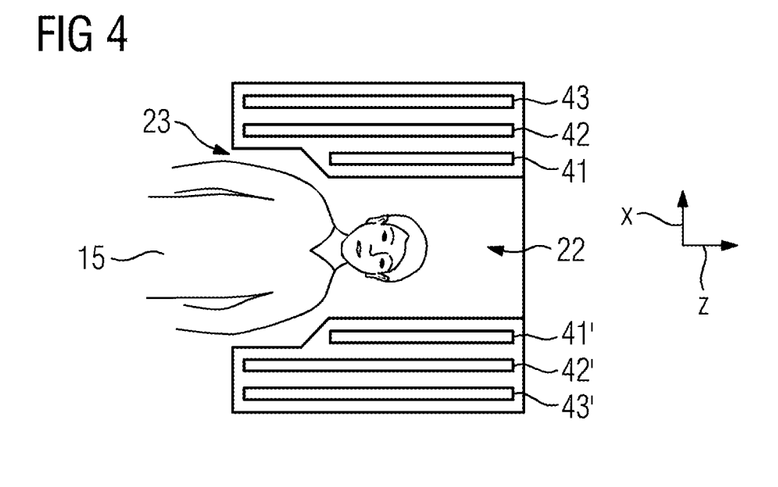
FIG. 4 schematically depicts a second embodiment of the gradient coil unit according to the invention.

FIG. 4 is a schematic depiction of a second embodiment of the gradient coil unit 21 according to the invention. FIG. 4 shows a cross section where y=0 of a second embodiment of the gradient coil 21 unit according to the invention. The gradient coil unit 21 includes the first conductor structure 41, 41', the second conductor structure 42, 42' and the third conductor structure 43, 43', wherein the first conductor structure 41, 41' is shorter in the longitudinal direction, i.e. parallel to the z-axis, than the second conductor structure 42, 42' and the third conductor structure 43, 43'. The region lying within the gradient coil unit 21, which is surrounded only radially by the second conductor structure 42, 42' and/or the third conductor structure 43, 43', but not by the first conductor structure 41, 41', can be referred to as the protruding region 23. The protruding region 23 is preferably not part of the examination region 22. Within the examination region 22, the magnetic field gradient is typically particularly homogeneous. The examination region 22 is typically only a partial region of the region surrounded by the first conductor structure 41, 41' and/or the region enclosed by the gradient coil unit 21 minus the protruding region 23. The examination region 22 typically adjoins the protruding region 23.

During a magnetic resonance examination, magnetic resonance signals within the examination region 22 are typically acquired or encoded. Accordingly, in the example depicted, image data of the head of the patient can be generated. In the example depicted, the shoulders of the patient 15 are outside the examination region 22, in particular within the protruding region 23. Accordingly, a part of the second conductor structure 42, 42' enclosing the protruding region 23 is preferably predominantly designed to reduce torque that occurs on the gradient coil unit upon generation of a magnetic field gradient 21. Nevertheless, according to this embodiment the first conductor structure 41, 41' and the second conductor structure 42, 42' can be jointly designed to generate a magnetic field gradient in the examination region 22 enclosed by the first conductor structure 41, 41'. The longitudinal end of the gradient coil unit 21 adjacent to the protruding region 23 is denoted $z_{min}$ in the following.

Figure 5:
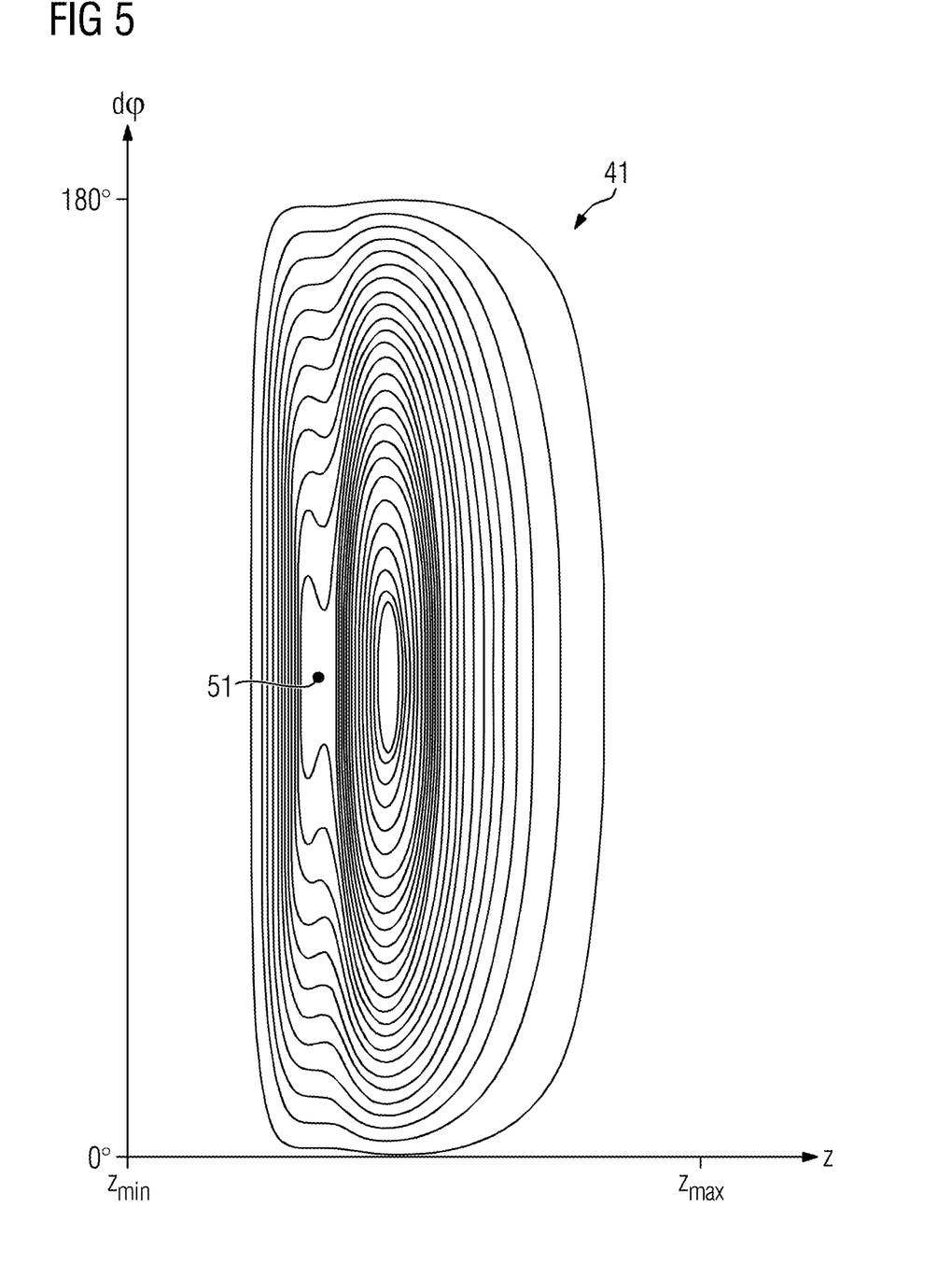
FIG. 5 schematically depicts an embodiment of a first conductor structure of the gradient coil unit according to the invention.

FIG. 5 is a schematic depiction of an embodiment of a first conductor structure 41. Herein, the first conductor structure 41 is depicted as planar (unrolled). The ordinate describes dφ. Within the gradient coil unit 21, the first conductor structure 41 is preferably designed as saddle-shaped with a first radius to the center point 0 of the gradient coil unit 21. It is evident that the first conductor structure 41 has a distance of at least one fifth, for example approximately about a quarter, of the length of the gradient coil unit 21 to the longitudinal end at $z_{min}$, which typically corresponds to the protruding region 23. The first conductor structure 41 is preferably designed as at least partially spiral and/or circular and/or helical. In the simplified embodiment depicted, the first conductor structure 41 encloses a first center point 51 in a circular shape. The course of the first conductor structure 41 is typically similar to that depicted, but in a spiral shape. The first conductor structure 41 can also enclose a further center point in a spiral shape. The position of the first center point 51 on the z-axis typically defines the center point of the gradient coil unit 21 and/or the center point of the examination region 22.

Figure 6:
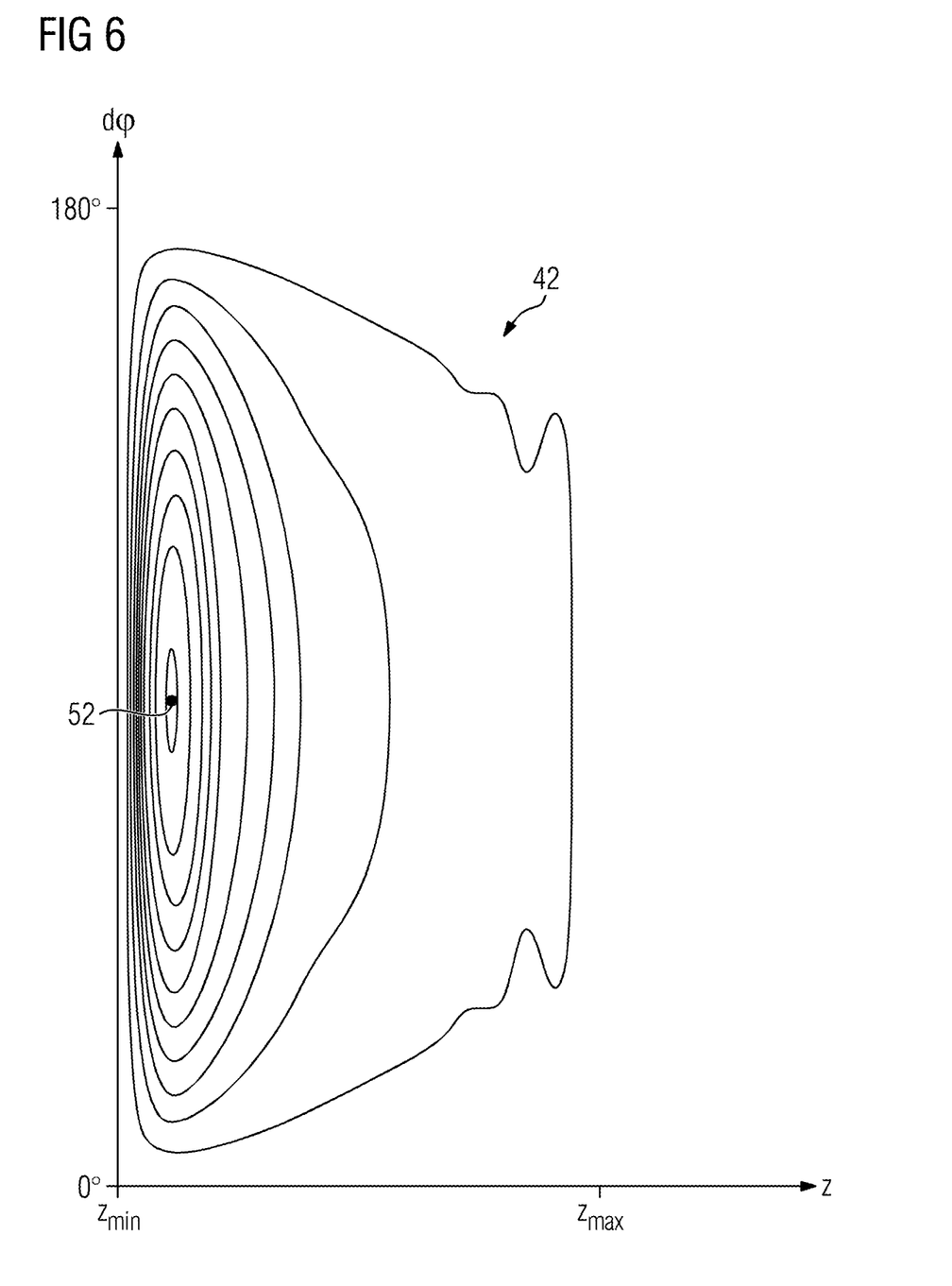
FIG. 6 schematically depicts an embodiment of a second conductor structure of the gradient coil unit according to the invention.

FIG. 6 is a schematic depiction of an embodiment of a second conductor structure 42. Herein, the second conductor structure 42 is depicted as planar (unrolled). Within the gradient coil unit 21, the second conductor structure 42 is preferably designed as saddle-shaped with a second radius to the center point 0 of the gradient coil unit 21. The second conductor structure 42 extends over the entire extent of gradient coil unit 21 in the z-direction. The first conductor structure 41 and/or the second conductor structure 42 can be designed to compensate torque that occurs on the gradient coil unit upon generation of a magnetic field gradient 21. The second conductor structure 42, in particular the part of the second conductor structure 42 lying in the protruding region 23, is designed to compensate torque that occurs on the gradient coil unit upon generation of a magnetic field gradient 21. In addition, the second conductor structure 42 is designed to generate a magnetic field gradient jointly with the first conductor structure 41. For both functionalities, the second conductor structure 42 is arranged in a spiral shape around a second center point 52. In the simplified embodiment depicted, the second conductor structure 42 encloses a second center point 52 in a circular shape. The course of the second conductor structure 42 is typically similar to that depicted, but in a spiral shape. The second center point 52 is preferably positioned closer to the longitudinal end of the gradient coil unit 21 that terminates the protruding region 23 than to the longitudinal end of the gradient coil unit 21 facing away from the protruding region 23. The second center point 52 is preferably positioned closer to the longitudinal end of the gradient coil unit 21 terminating the protruding region 23 than the first center point 51. The second conductor structure is preferably designed such that the spatial density of the second conductor structure in the region between the second center point 52 and the longitudinal end terminating the protruding region 23 is at least 30%, preferably at least 50%, particularly preferably at least 70% greater than in the region between the second center point 52 and the longitudinal end lying opposite to the protruding region 23.

Figure 7:
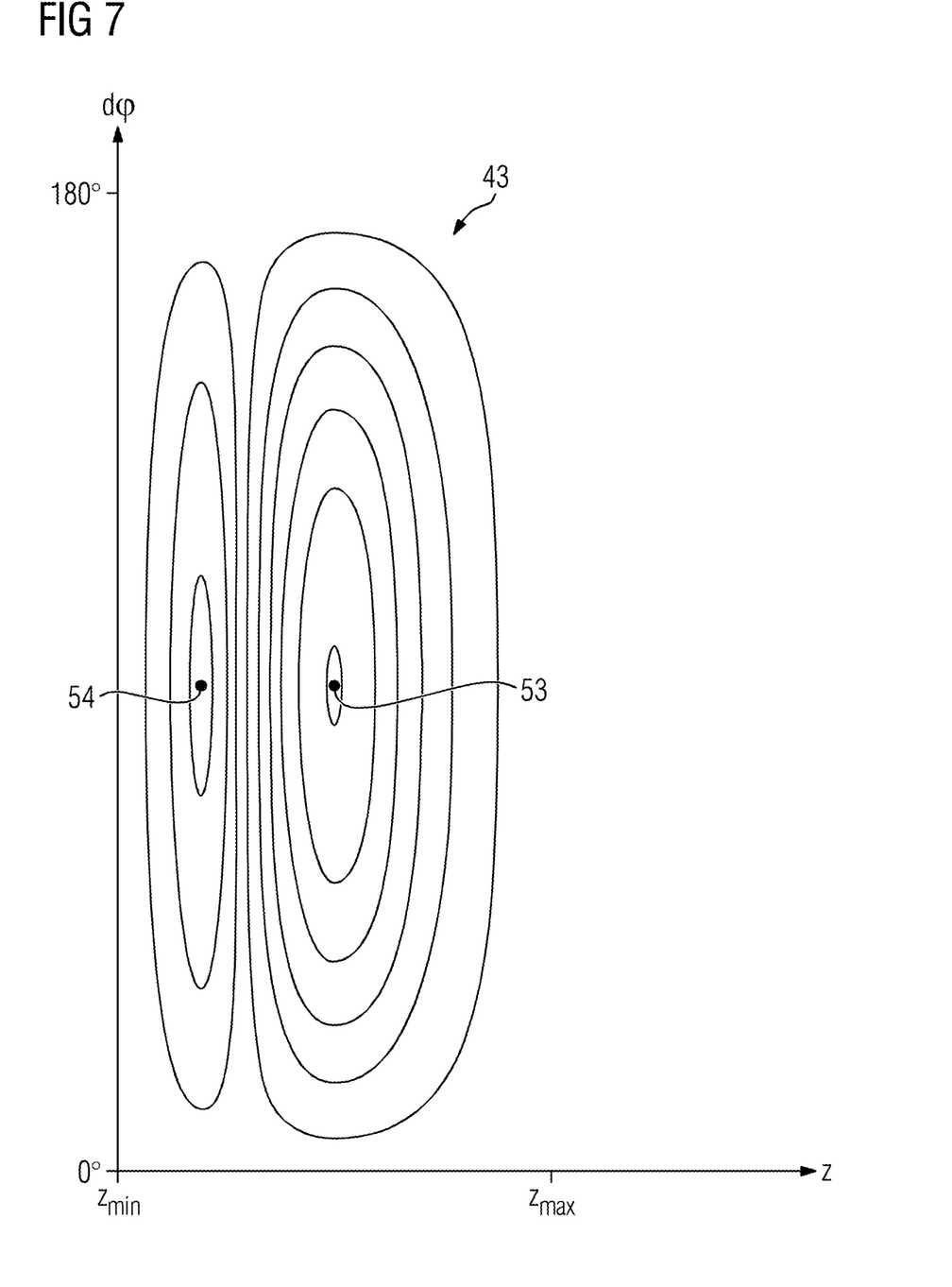
FIG. 7 schematically depicts an embodiment of a third conductor structure of the gradient coil unit according to the invention.

FIG. 7 is a schematic depiction of an embodiment of a third conductor structure 43. Herein, the third conductor structure 43 is depicted as planar (unrolled). Within the gradient coil unit 21, the third conductor structure 43 is designed as saddle-shaped with a third radius to the center point 0 of the gradient coil unit 21. The third conductor structure 43 extends over at least 80%, preferably over at least 90% of the extent of the gradient coil unit 21 in the z-direction. The third conductor structure 43 is designed to compensate a stray magnetic field that occurs on generation of a magnetic field gradient by the first conductor structure 41 and/or second conductor structure 42. In the simplified embodiment depicted, the third conductor structure 43 encloses the center points 53, 54 in a circular shape. The course of third conductor structure 43 is similar to that depicted, but in a spiral shape. On viewing the projection onto the z-axis, the first center point 51 is preferably arranged between the two center points 53, 54.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A gradient coil unit for a magnetic resonance apparatus, said gradient coil unit comprising:
   a first conductor structure that defines a surface of a first cylinder that has a first radius;
   a second conductor structure that defines a surface of a second cylinder having a second radius; and
   a third conductor structure that defines a surface of a third cylinder having a third radius;
   wherein said first radius is smaller than said second radius, and said second radius is smaller than said third radius, and
   wherein said gradient coil unit has a longitudinal direction, and said first conductor structure is shorter in said longitudinal direction than said second conductor structure and said third conductor structure.

2. A magnetic resonance apparatus, comprising:
   a magnetic resonance data acquisition scanner;
   a gradient coil unit situated in said magnetic resonance data acquisition scanner; and
   said gradient coil unit comprising a first conductor structure that defines a surface of a first cylinder that has a first radius, a second conductor structure that defines a surface of a second cylinder having a second radius, and a third conductor structure that defines a surface of a third cylinder having a third radius, wherein said first radius is smaller than said second radius, and said second radius is smaller than said third radius, and wherein said gradient coil unit has a longitudinal direction, and said first conductor structure is shorter in said longitudinal direction than said second conductor structure and said third conductor structure.

3. The gradient coil unit as claimed in claim 1, wherein said third conductor structure at least partially radially surrounds said second conductor structure, and said second conductor structure at least partially radially surrounds said first conductor structure.

4. The gradient coil unit as claimed in claim 1, wherein said first conductor structure and said second conductor structure are jointly designed so as to generate a magnetic field gradient in a direction of an examination region enclosed by said first conductor structure.

5. The gradient coil unit as claimed in claim 1, wherein at least one of said first conductor structure and said second conductor structure is designed to compensate a torque that acts on said gradient coil unit upon generation of a magnetic field gradient by said gradient coil unit.

6. The gradient coil unit as claimed in claim 1, wherein said third conductor structure is designed to compensate a stray magnetic field that occurs upon generation of a magnetic field gradient by at least one of said first conductor structure and said second conductor structure.

7. The gradient coil unit as claimed in claim 1, having a longitudinal direction, and wherein said second conductor structure comprises a protruding region in which said first conductor structure is shorter in the longitudinal direction than the second conductor structure, and wherein said second conductor structure is designed to reduce a torque that occurs in said gradient coil unit upon generation of a magnetic field gradient.

8. The gradient coil unit as claimed in claim 1, wherein said first, second and third conductor structures allow flexible positioning thereof within a patient receiving region of a magnetic resonance scanner.

9. The gradient coil unit as claimed in claim 1, wherein at least one of said first conductor structure, said second conductor structure and said third conductor structure is designed asymmetrically.

10. The gradient coil unit as claimed in claim 1, wherein said second conductor structure proceeds spirally around a center point.

11. The gradient coil unit as claimed in claim 1, wherein said third conductor structure spirally surrounds at least two center points.

12. The gradient coil unit as claimed in claim 1, comprising two first conductor structures, two second conductor structures, and two third conductor structures, with each of the two first conductor structures, each of the two second conductor structures, and each of the two third conductor structures being situated respectively within one-half of the gradient coil unit, thereby making said gradient coil unit symmetrical.

* * * * *